US012640337B2

(12) United States Patent
Huang

(10) Patent No.: US 12,640,337 B2
(45) Date of Patent: May 26, 2026

(54) AUTOFOCUS METHOD FOR SINGLE BEAM AND MULTI-BEAM SYSTEMS

(71) Applicant: KLA Corporation, Milpitas, CA (US)

(72) Inventor: Weijie Huang, Fremont, CA (US)

(73) Assignee: KLA Corporation, Milpitas, CA (US)

( * ) Notice: Subject to any disclaimer, the term of this patent is extended or adjusted under 35 U.S.C. 154(b) by 384 days.

(21) Appl. No.: 18/207,644

(22) Filed: Jun. 8, 2023

(65) Prior Publication Data

US 2024/0412944 A1     Dec. 12, 2024

(51) Int. Cl.
*H01J 37/21* (2006.01)

(52) U.S. Cl.
CPC .................................... *H01J 37/21* (2013.01)

(58) Field of Classification Search
USPC ........................................................ 250/310
See application file for complete search history.

(56) References Cited

U.S. PATENT DOCUMENTS

| | | | |
|---|---|---|---|
| 9,530,613 B2 | 12/2016 | Rogers et al. | |
| 2006/0289751 A1 | 12/2006 | Watanabe et al. | |
| 2018/0068825 A1* | 3/2018 | Brodie ............... | G01N 23/2251 |
| 2018/0335396 A1* | 11/2018 | Nagano ................... | H01J 37/28 |
| 2019/0004298 A1 | 1/2019 | Honjo et al. | |
| 2020/0013585 A1 | 1/2020 | Inoue et al. | |
| 2020/0168430 A1 | 5/2020 | Inoue et al. | |
| 2020/0365364 A1 | 11/2020 | Shintani et al. | |
| 2022/0044907 A1 | 2/2022 | Trauner et al. | |
| 2022/0246388 A1 | 8/2022 | Rauwolf et al. | |
| 2022/0328284 A1* | 10/2022 | Stopka ................... | H01J 37/153 |
| 2024/0242928 A1* | 7/2024 | Kuroda ................ | H01J 37/222 |

FOREIGN PATENT DOCUMENTS

| | | | | | |
|---|---|---|---|---|---|
| CN | 105049702 A | 8/2019 | | | |
| DE | 102021105201 A1 | 9/2022 | | | |
| JP | 2001068048 A | 3/2001 | | | |
| JP | 2018128542 A | 8/2018 | | | |
| JP | 2021128119 A | 9/2021 | | | |
| JP | WO 2022269925 | * 12/2022 | .............. | H01J 37/21 |
| TW | 202211287 A | 3/2022 | | | |
| WO | 2019079139 A1 | 4/2019 | | | |
| WO | 2022069073 A1 | 4/2022 | | | |

OTHER PUBLICATIONS

Pinkard et al., "Deep learning for single-shot autofocus microscopy," Technical Report, University of California at Berkeley, Dec. 2019.
Hsu et al., "Development of the fast astigmatic auto-focus microscope system," Measurement Science and Technology, 2009, vol. 20, No. 4.

(Continued)

*Primary Examiner* — Kiet T Nguyen
(74) *Attorney, Agent, or Firm* — Hodgson Russ LLP

(57) ABSTRACT

An electron beam is directed at a workpiece on a stage with a first astigmatism applied. The electron beam reflected off the workpiece is detected and an image of the workpiece with the first astigmatism applied is generated. An autofocus model is applied to the image to determine a focus offset for the image with the autofocus model.

20 Claims, 5 Drawing Sheets

(56)                    References Cited

OTHER PUBLICATIONS

Zhang et al., "Fast and accurate auto-focusing algorithm based on the combination of depth from focus and improved depth from defocus," Optics Express, 2014, vol. 22, No. 25.

Luo et al., "Single-shot autofocusing of microscopy images using deep learning," ACS Photonics, 2021, vol. 8, No. 2.

Pinkard et al., "Deep learning for single-shot autofocus microscopy," Optica, Jun. 2019, 794-797, vol. 6, No. 6.

WIPO, International Search Report issued for PCT/US2024/031800, Sep. 30, 2024.

* cited by examiner

Focal series of an astigmatic beam

Astigmatic e-beam z profile                    PSF

Focal series of a round beam

Round e-beam z profile                    PSF

AUTOFOCUS METHOD FOR SINGLE BEAM AND MULTI-BEAM SYSTEMS

FIELD OF THE DISCLOSURE

This disclosure relates to electron beam systems.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it maximizes the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etching, deposition, and ion implantation. An arrangement of multiple semiconductor devices fabricated on a single semiconductor wafer may be separated into individual semiconductor devices.

A workpiece can be inspected using an optical system. However, the dimensions for some of the features of the workpiece or the size of defects to be identified may be below the optical resolution, making some of the defects non-resolvable with the optical system. Charged particles, such as electrons, can be used to inspect the surface of the workpiece in this situation. This can provide a better resolution than optical systems.

Throughput is an important consideration for inspecting and other imaging applications, such as in the semiconductor industry. A proper focus of a convergent electron beam on a workpiece increases the quality of imaging and inspecting. Some systems offer a semi-automated focus that includes a user assisting with a focusing routine. Some autofocus concepts also have been described for fully automated focusing of a beam on a workpiece. The time used to autofocus the charged particle beam adds to the total time for imaging a region on the workpiece, which decreases the throughput. This may be particularly relevant for imaging with multi-beam inspection tools, for which a plurality of beamlets are focused on a workpiece.

The quality of an electron beam image deteriorates due to causes such as astigmatism of the electron beam system and degradation of the resolution caused by defocusing. A poor quality electron beam image causes deterioration of the inspection sensitivity and the performance of the length measurement. In addition, in such an image, the pattern width varies and detection of an image edge cannot be performed in a relatively stable manner. Results of measuring the dimensions with such a poor quality beam will often be unsatisfactory.

Conventionally, the focal point and the astigmatism of an electron beam optical system can be adjusted by changing a control current of an objective lens and control currents while visually observing an electron beam image. The focal point can be adjusted by varying the convergence height of a beam. The convergence height of a beam is changed by adjusting a current flowing through the objective lens.

Conventional image-based autofocus methods for an electron beam apparatus can involve stepping a focus knob (e.g., a lens current or voltage) through a focal series that brackets both sides of the optimal focal plane. At each step, an image is taken. The sharpness score is calculated from each step image. The data set of sharpness score versus focus knob value is fitted with a curve and the point where a maximal score is derived from the fitted curve. The focus knob value corresponding to the best derived sharpness score is then assigned to the lens power supply as the new focus value.

This conventional approach limits throughput. Obtaining a desired focus value involves stepping a power supply and acquiring images multiple times. The entire operation takes an amount of time proportional to the number of steps in the autofocus sequence. A fine-stepped autofocus has smaller step size and more step count, which needs a longer operation time. In many automated, high-throughput industrial applications of electron microscopy, autofocus operation is conducted periodically and frequently. The time taken for the autofocus operation directly affects the system throughput for those applications.

This conventional approach also cannot be performed in real-time, continuous applications, such as swathing. In a swathing operation, a stage is continuously moving while the electron beam apparatus continuously acquires images. Tracking the focus of the image continuously and correcting it in real-time, as performed using a servo control loop, is not possible with conventional autofocus methods because of the time duration needed to complete the autofocus.

Improved systems and techniques are needed.

BRIEF SUMMARY OF THE DISCLOSURE

An electron beam system is provided in a first embodiment. The electron beam system includes an electron beam source that generates at least one electron beam; a stage configured to hold a workpiece in a path of the electron beam; at least one lens in the path of the electron beam that is configured to control astigmatism of the electron beam; a detector configured to image the workpiece using the electron beam; and a processor in electronic communication with the detector and the electron beam source. The processor is configured to: generate an image of the workpiece with a first astigmatism applied; apply an autofocus model to the image; and determine a focus offset for the image using the autofocus model.

An amount and a direction of the first astigmatism can be the same as those used during training of the autofocus model.

The processor can include at least one graphics processing unit (GPU).

The autofocus model can be trained using at least one model for a device on the workpiece.

In an instance, only one of the image with the first astigmatism is used to determine the focus offset.

The electron beam source can generate more than two electron beams.

The processor can be further configured to send instructions for the lens to adjust for the focus offset. The lens may be an objective lens. The processor also can be further configured to send instructions to generate a second image of the workpiece after the lens adjusts for the focus offset.

A method is provided in a second embodiment. The method includes directing an electron beam at a workpiece on a stage. The electron beam has a first astigmatism applied. The electron beam reflected off the workpiece is detected using a detector. Using a processor, an image of the workpiece with the first astigmatism applied is generated. Using the processor, an autofocus model is applied to the image. Using the processor, a focus offset for the image is determined with the autofocus model.

The method can further include training the autofocus model with at least one model for a device on the workpiece.

An amount and a direction of the first astigmatism can be a same as those used during the training of the autofocus model.

In an instance, only the image with the first astigmatism is used to determine the focus offset.

The method can further include sending instructions, using the processor, to adjust for the focus offset in the electron beam. The method also can include generating a second image of the workpiece after the focus offset is adjusted.

The directing can include more than two electron beams. The stage can move at a constant velocity during the directing. The stage also can move prior to the generating.

A non-transitory computer-readable storage medium is provided in a third embodiment. The non-transitory computer-readable storage medium comprises one or more programs for executing the following steps on one or more computing devices. An image of a workpiece is generated with a first astigmatism applied. An autofocus model is applied to the image. A focus offset is determined for the image using the autofocus model.

The steps can include sending instructions to adjust for the focus offset.

An amount and a direction of the first astigmatism can be a same as those used during training of the autofocus model.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein provide an image-based method to increase autofocus speed for single and multi-beam electron beam systems. A single-shot, image-based autofocus method uses an astigmatic beam to generate an asymmetric focus series. A machine-learning based method can infer focus offset based on a defocus, astigmatic image. Auxiliary autofocus beams can be added to the main inspection beam array to perform real-time autofocus during swathing. Same or varying astigmatic ("stig") values can be added to the autofocus beams to add robustness to the focus result.

Embodiments disclosed herein can speed up autofocus operation by reducing the number of imaging steps. A training step during setup time is used to train the autofocus model. In the training step, a focus series of images from various target locations on the workpiece are acquired. To be relevant to the imaging area interested, the training can be done in a user care area to capture characteristic pattern features that may be encountered later during operation.

Figures 1, 2:
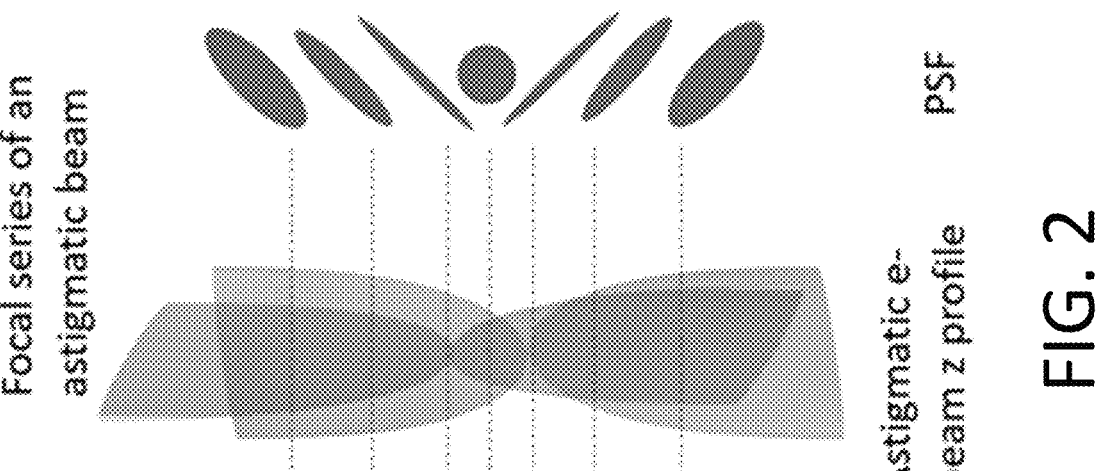
FIG. 1 is a focal series for a round beam.
FIG. 2 is a focal series for an astigmatic beam.

To acquire the focus series of images, a focus knob is stepped. For example, the lens power supply value can be stepped. A known, controlled amount of astigmatism is added to the electron beam during stepping of the focus knob. The focal series of a round beam is insensitive to which side of the ideal focal plane it is at (FIG. 1), while that of an astigmatic beam (FIG. 2) is asymmetric depending on if the plane is above or below the ideal focal plane. Therefore, the sign of the focus offset can be determined.

The focus series of images can be specific to a particular workpiece, a particular device on the workpiece, or a device or devices in a particular care area. The focus series of images also can be more general with related types of semiconductor devices (e.g., logic or memory devices). The autofocus model can include images with multiple different patterns, patterns for a particular manufacturer or manufacturing facility (a "fab"), or patterns specific to the particular device being inspected.

The focus series of images can include images of actual devices. The focus series of images also can include synthesized images. If the design pattern files are available from a semiconductor manufacturer, then the defocus, astigmatic images can be simulated to train the model without actually imaging the wafer.

The number of images in the focus series of images can vary depending on the wafer pattern. If the subject has highly repeating patterns such as a memory array, then 1-3 sites may be needed. If more unique features are involved, such as in logic devices, then taking training data from 5-10 unique structures may be needed. The point spread function from the images can be extracted such that the sharpness calculation is independent from the pattern itself.

In an instance, training images can be grabbed automatically if a user selects a care area. These images can be specific to a care area that will be later inspected during operation. The grabbed images can become the focus series of images.

The astigmatic focus series of images is assigned with a series of known focus knob value. Typically a knob value controls a focus lens, which can be a magnetic lens controlled by the lens current or an electrostatic lens controlled by the lens voltage. When the knob is adjusted, it means the current or the voltage of that lens is adjusted.

The pairs of images and knob values are then provided to a machine learning training model to associate the individual image with the knob value. Alternatively, instead of feeding the image-knob value pairs to the training model, a point spread function (PSF) can be first extracted from the focal series images. The PSF-knob value pairs can be provided to the machine learning training model. A goal for the machine learning training model is to be able to infer a focus knob value when provided with a single defocus and astigmatic image during runtime, also known as a single-shot autofocus. After the model training is completed, the autofocus can be ready for operation.

In an instance, the knob values are stepped in series. For example, the objective lens voltage can be stepped.

Astigmatism value can be controlled using voltage in the case of an electrostatic stigmator or using current in the case of a magnetic stigmator. Astigmatism values for voltage can be from 1-10 V. Astigmatism values for current can be from 0.1-10 mA. Other values are possible and these are merely examples.

Figure 3:
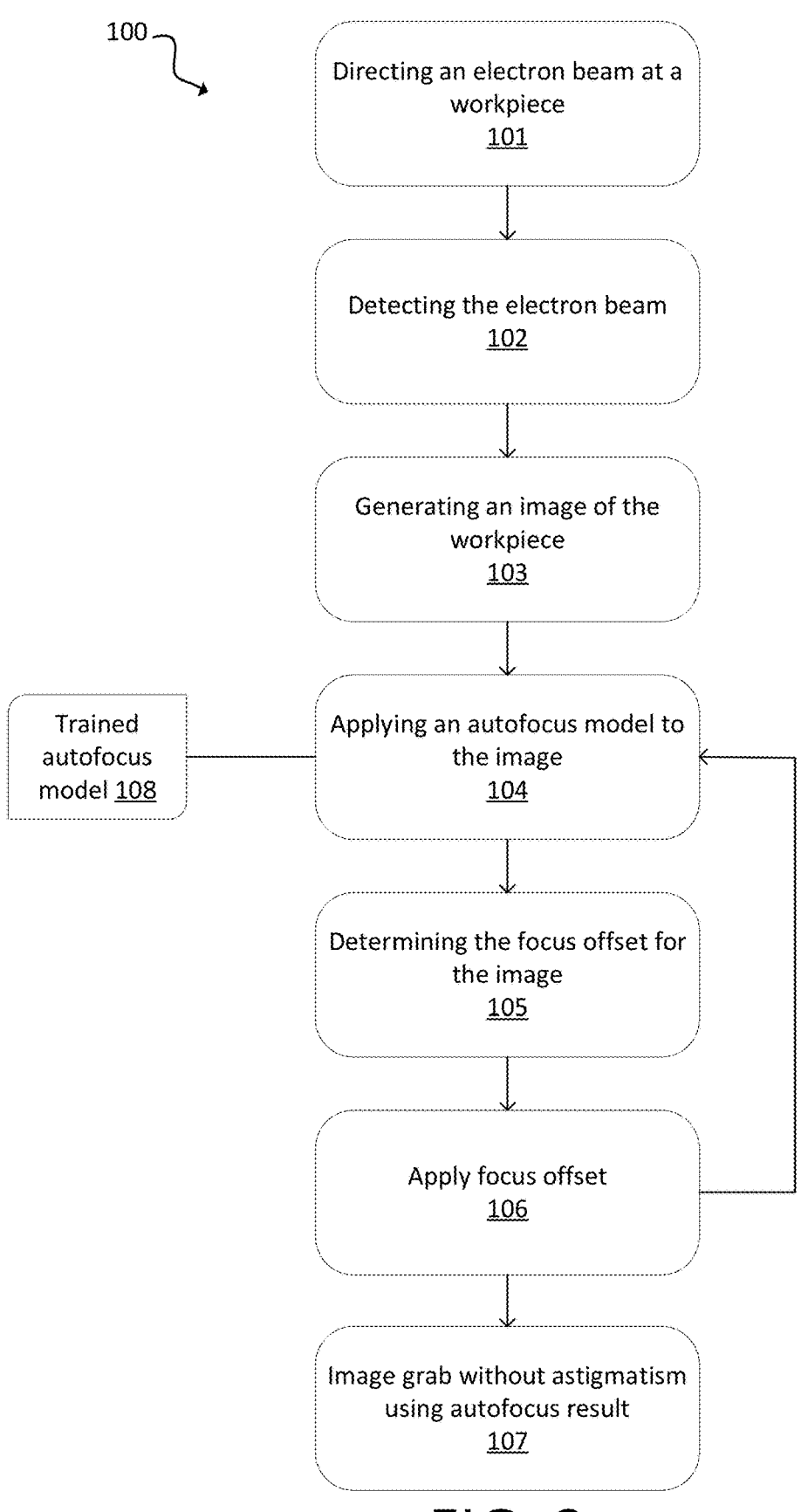
FIG. 3 is a flowchart of an embodiment of an autofocus method in accordance with the present disclosure.

FIG. 3 is a flowchart of a method 100, which can be used for step-and-scan autofocus. The method 100 uses a trained autofocus model. Some of the steps of the method 100 can be performed using a processor. During step-and-scan automated imaging operation, the stage moves, autofocus is performed, and image acquisition is performed. This process can be repeated one or more times across the workpiece.

At 101, an electron beam is directed at a workpiece, such as a semiconductor wafer. The electron beam has a first astigmatism applied. The electron beam reflected off a surface of the workpiece is detected at 102 using a detector. Then, an image of the workpiece is generated at 103. The image of the workpiece uses the electron beam with the first astigmatism. This image can be a single image of the workpiece that is used to determine to the focus offset. The first astigmatism can help determine if the image is overfocused or underfocused.

The first astigmatism may be large enough such that the focus series can show the difference between above and below the optimal focal plane. However, the first astigmatism may not be so large that the focus series are completely distorted by astigmatism. An astigmatism value can be selected such that a reliable focus series is created to generate matching focus scores or point spread functions. This can be done either empirically or with image simulation.

When the electron optical condition (which determines the ray path of the electrons travelling across the electron microscope column) is calibrated, the point spread function with a given astigmatism and focus can be simulated. If a certain amount of astigmatism is known to be able to generate a good autofocus training series, voltage needed to create such astigmatism in the electron optics can be determined.

The autofocus model is applied to the image at 104. This can use the trained autofocus model 108, which was trained using the astigmatic focus series of images. In an instance, a deep learning neural network can be used with the autofocus model. The astigmatic focus series of images can cover or include a model of the device on the workpiece that is going to be imaged using the method 100. An amount and a direction of the first astigmatism is the same as used during the training of the autofocus model.

As the result of the training step, the output of the training is an autofocus model that pairs astigmated defocused images with known focus offsets. In the inference step, the input to the model is a defocus image with known astigmatism and an unknown amount of defocus and the output of the model is the focus offset.

The image can be fed to a high speed machine learning processor (e.g., a GPU) with minimal latency. A potential data path with such short latency can be a linkage between a data acquisition device connected directly to a GPU on the same peripheral component interconnect (PCI) bus without routing through the system's central processing unit (CPU)

or system's memory. This kind of linkage can be referred to as direct memory access (DMA). In an instance, a data acquisition field programmable gate array (FPGA) and a data processing GPU are both integrated on a same printed circuit board (PCB) with optimized, direct interconnect in between. The machine learning processor can be the processor used in other steps of the method 100 or can be a separate processor.

Because the time from image to focus result affects throughput, a shorter processing time is usually preferred. The time to result can be less than $\frac{1}{10}$ of the image grab time, which is typically 100 μs.

A focus offset is determined for the image at 105. The autofocus model, running in a GPU processor, can output the focus offset corresponding to the input image. This approach can achieve a desired focused image with only a single autofocus image grab. For robustness, the autofocus process can be repeated to improve the accuracy (as shown in FIG. 3). Repeating steps 104-106 can provide iterative process control.

In the training model, the point spread function extracted from each step image is paired with a known focus offset. In the interference step, the point spread function is first extracted from the runtime astigmatic image, which is matched with PSF of the series of training images by the model. The training image that has the closest PSF to the runtime image is then picked as the image with the closest focus offset condition. Its corresponding focus offset is outputted as a result.

The focus offset is then applied to the electron beam system at 106. This can be a signed Z focus offset. Instructions can be sent to components in the electron beam system to adjust for the focus offset. For example, the lens value can be updated. The focus offset can be applied to the same knob with which the training series is obtained with.

"Signed Z" means the Z offset with +/−signed. Z=0 means being at the optimal focus point. +Z means Z μm above the optimal focus point and −Z means Z μm below the optimal focus point. There can be a lens sensitivity table to convert Z in μm to lens control current or voltage. Using Z in μm as focus offset can abstract the actual lens current/voltage from the algorithm so the algorithm does not need to know which lens is used to achieve such focus offset as long as a certain focus offset distance Z is achieved.

An image grab is performed using the autofocus result and without the first astigmatism at 107. This image grab can include detecting the electron beam reflected from the surface of the workpiece and generating an image of the workpiece. Thus, a second image of the workpiece can be generated after the focus offset is adjusted. The image grab at 107 can be in focus because the focus offset was adjusted.

While the method 100 can repeat steps 104-106, it is possible to work from a single image. Thus, only the image from the step 103 may be used. Existing autofocus techniques involve 6-10 steps, but this can be replaced with a single step using the embodiments disclosed herein. Therefore, embodiments disclosed herein can be from 6×-10× faster than previous techniques.

Some embodiments can use more than two electron beams. The stage can move at a constant velocity while the electron beam is directed at the workpiece or the stage can move between imaging steps of the workpiece (e.g., the stage moves prior to generating the image).

In a multi-beam system, the imaging system has more than one beam or beamlet for simultaneous image acquisition. Embodiments of the autofocus method disclosed herein can be applied to a step-and-scan operation or a swathing style of operation. In a step-and-scan operation, the stage alternatingly moves and pauses. In a swathing operation, the stage is continuously moving at a constant velocity, while the beam or beams are performing a line scan across the area of interest. The simultaneous motion of the stage and the line scan of the beam(s) produces a 2D raster scan image.

Figure 4:
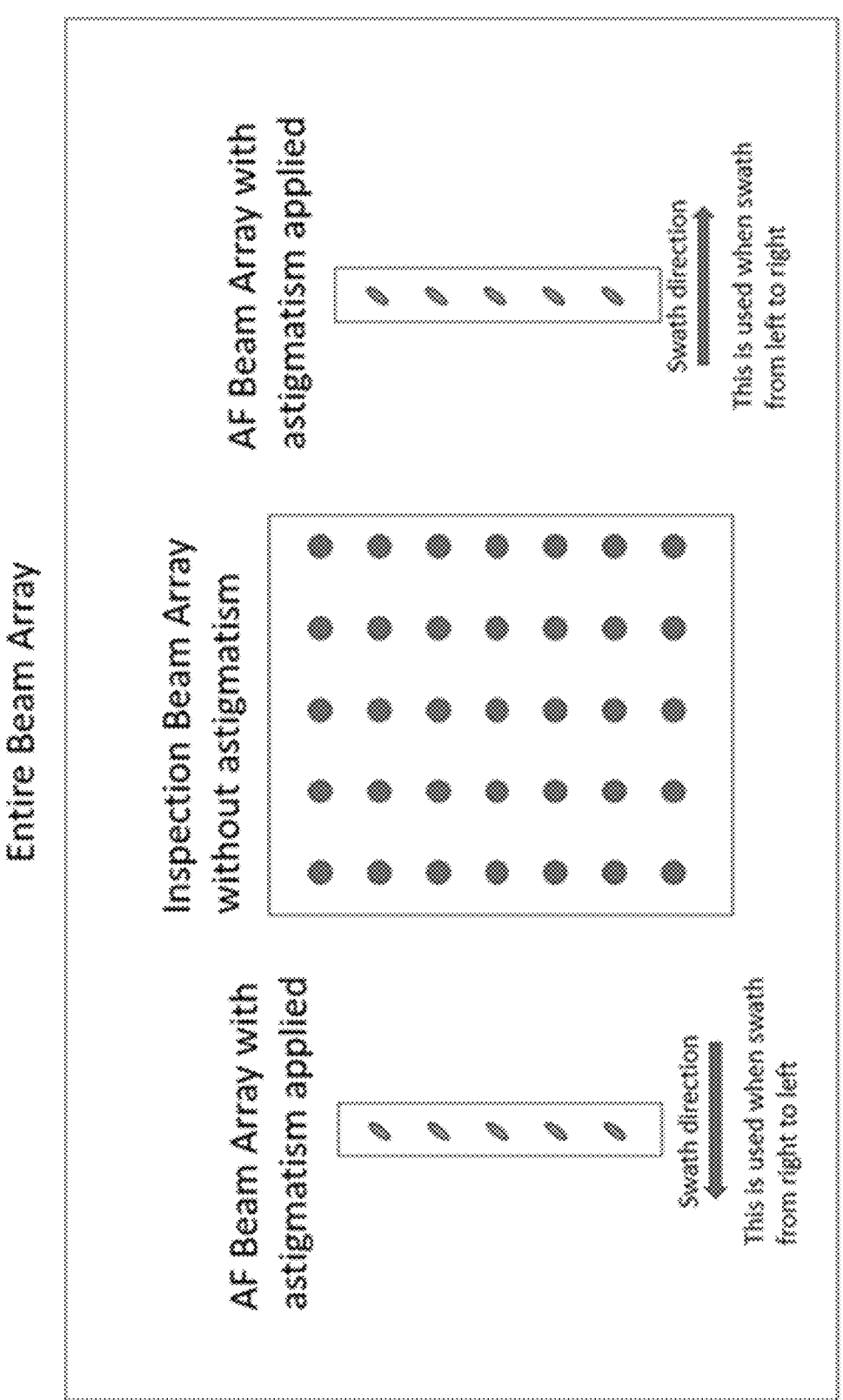
FIG. 4 illustrates real-time autofocus during swathing for a multi-beam system.

In a multi-beam system, in addition to the main beam array that is used for inspection imaging, some auxiliary arrays of beams can be located on the side of the main array for autofocus purpose. As shown in FIG. 4, two auxiliary arrays of beam are located on either side of the main inspection beam array. These arrays, called the autofocus beam arrays, are used for autofocus purpose. The autofocus beam arrays constantly have astigmatism applied to them while acquiring an image.

When the beam array is swathing from left to right (i.e., the beam array is static and the stage is swathing from right to left), the right autofocus (AF) array is used. The images acquired with the beams in this autofocus array can be fed to the autofocus model, trained during setup time as mentioned previously herein, and the focus offset value can be updated constantly in real-time. Similarly, when the beam array is swathing from right to left, the left autofocus array can be used.

Because the autofocus is located on the right side the inspection array, it will first see a focus change before the inspection array, which provides time for the inspection array to adjust focus based on the result found by the autofocus beam array. Thus, the autofocus array can preview the focus variation ahead.

The same astigmatism value can be applied to all the beams in the autofocus array. Each beam can generate a focus score, and the averaged focus score out of all the autofocus beams can be the final score. The final score can be the focus offset applied to the beamlets used for imaging. The final score can be applied globally to the entire beam array's focus. This method adds redundancy to the autofocus process in case a blank or featureless area is encountered.

In another instance, different astigmatism values can be applied to each beam in the autofocus array. Each astigmatism value corresponds to unique training data set (trained with this astigmatism value applied to the beam). This method adds redundancy to the machine learning models to prevent one model from over-predicting. Again, an averaged result is output as the final focus score.

Figure 5:
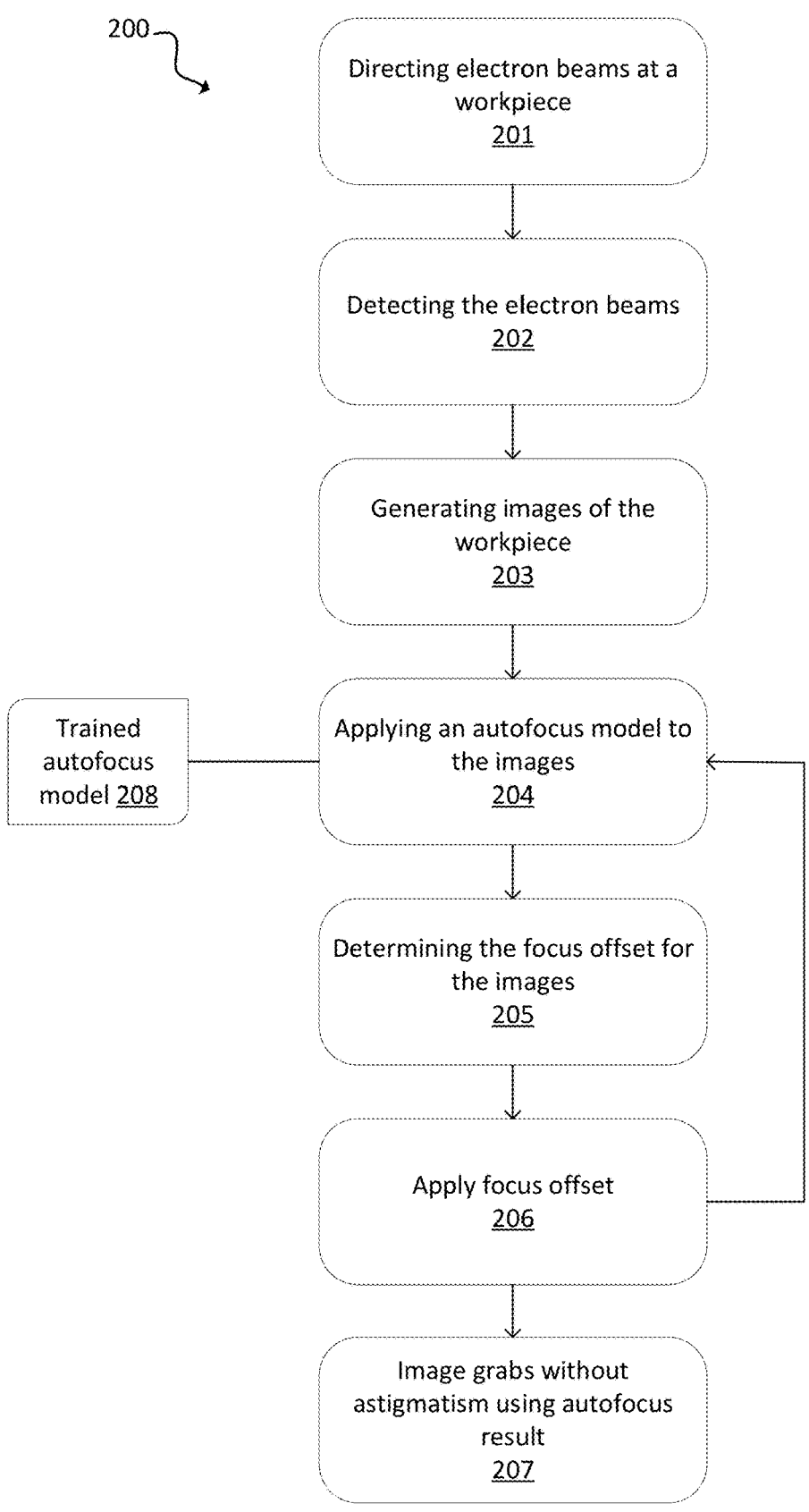
FIG. 5 is a flowchart of an embodiment of an autofocus method for multi-beam swathing in accordance with the present disclosure.

Such autofocus sequence for multi-beam swathing is illustrated in FIG. 5, where multiple autofocus images are constantly acquired and fed to the autofocus model, with equal or varying astigmatism applied to the autofocus beams. A focus offset from the model can be applied to the entire beam array (including the autofocus beam arrays and the inspection beam array) continuously. The steps 201-207 are similar to the steps 101-107 except that multiple electron beams are used. The trained autofocus model 208 may be the same as the trained autofocus model 108. The electron beams in step 201 can have the same astigmatism value or different astigmatism values.

Figure 6:
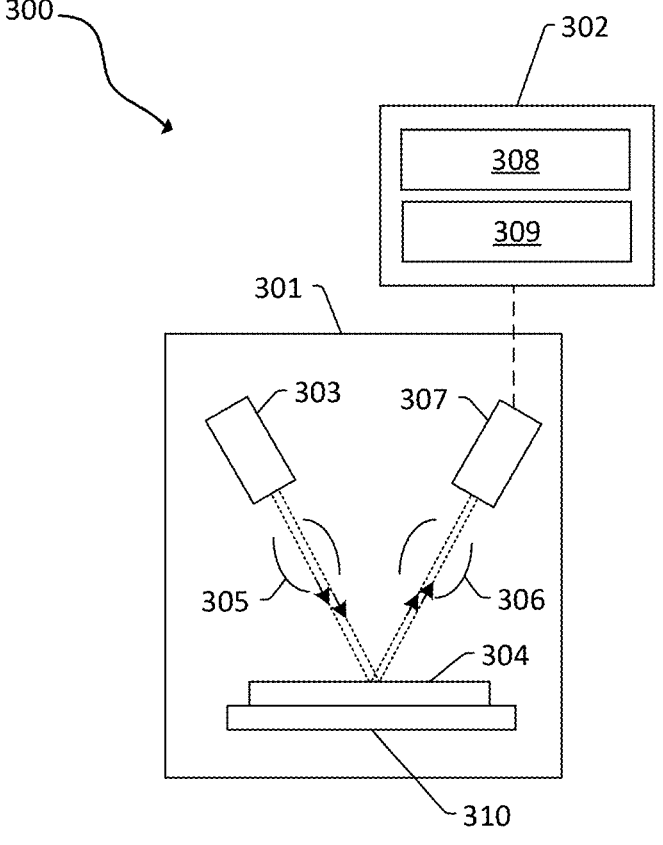
FIG. 6 is a block diagram of an electron beam system in accordance with the present disclosure.

FIG. 6 is a block diagram of an embodiment of an electron beam system 300. The electron beam system 300 includes a workpiece inspection system (which includes the electron column 301) configured to generate images of a workpiece 304, such as a semiconductor wafer.

The workpiece inspection system includes an output acquisition subsystem that includes at least an energy source and a detector. The output acquisition subsystem may be an electron beam-based output acquisition subsystem. For example, in one embodiment, the energy directed to the workpiece 304 includes electrons, and the energy detected from the workpiece 304 includes electrons. In this manner, the energy source may be an electron beam source. In one such embodiment shown in FIG. 6, the output acquisition subsystem includes electron column 301, which is coupled to computer subsystem 302. A stage 310 may hold the workpiece 304. The stage 310 can be translated.

As also shown in FIG. 6, the electron column 301 includes an electron beam source 303 configured to generate electrons in the form of one or more electron beams that are focused to workpiece 304 by one or more elements 305. The electron beam source 303 may include, for example, a cathode source or emitter tip. The one or more elements 305 may include, for example, a gun lens, an anode, a beam limiting aperture, a gate valve, a beam current selection aperture, an objective lens, and a scanning subsystem, all of which may include any such suitable elements known in the art.

Electrons returned from the workpiece 304 (e.g., secondary electrons) may be focused by one or more elements 306 to detector 307. One or more elements 306 may include, for example, a scanning subsystem, which may be the same scanning subsystem included in element(s) 305.

The electron column 301 also may include any other suitable elements known in the art.

Although the electron column 301 is shown in FIG. 6 as being configured such that the electrons are directed to the workpiece 304 at an oblique angle of incidence and are scattered from the workpiece 304 at another oblique angle, the electron beam may be directed to and scattered from the workpiece 304 at any suitable angles. In addition, the electron beam-based output acquisition subsystem may be configured to use multiple modes to generate images of the workpiece 304 (e.g., with different illumination angles, collection angles, etc.). The multiple modes of the electron beam-based output acquisition subsystem may be different in any image generation parameters of the output acquisition subsystem.

Computer subsystem 302 may be coupled to detector 307 as described above. The detector 307 may detect electrons returned from the surface of the workpiece 304 thereby forming electron beam images of the workpiece 304. The electron beam images may include any suitable electron beam images. Computer subsystem 302 may be configured to perform any of the functions described herein using the output of the detector 307 and/or the electron beam images. Computer subsystem 302 may be configured to perform any additional step(s) described herein. A system 300 that includes the output acquisition subsystem shown in FIG. 6 may be further configured as described herein.

It is noted that FIG. 6 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

Although the output acquisition subsystem is described above as being an electron beam-based output acquisition subsystem, the output acquisition subsystem may be an ion beam-based output acquisition subsystem. Such an output acquisition subsystem may be configured as shown in FIG. 6 except that the electron beam source may be replaced with any suitable ion beam source known in the art. In addition, the output acquisition subsystem may be any other suitable ion beam-based output acquisition subsystem such as those included in commercially available focused ion beam (FIB) systems, helium ion microscopy (HIM) systems, and secondary ion mass spectroscopy (SIMS) systems.

The computer subsystem 302 includes a processor 308 and an electronic data storage unit 309. The processor 308 may include a microprocessor, a microcontroller, or other devices. For example, the processor 308 may include or be a GPU.

The computer subsystem 302 may be coupled to the components of the system 300 in any suitable manner (e.g., via one or more transmission media, which may include wired and/or wireless transmission media) such that the processor 308 can receive output. The processor 308 may be configured to perform a number of functions using the output. The workpiece inspection system can receive instructions or other information from the processor 308. The processor 308 and/or the electronic data storage unit 309 optionally may be in electronic communication with another workpiece inspection system, a workpiece metrology system, or a workpiece review system (not illustrated) to receive additional information or send instructions.

The processor 308 is in electronic communication with the workpiece inspection system, such as the detector 307, or other components therein. The processor 308 may be configured to process images generated using measurements from the detector 307. For example, the processor may perform embodiments of the method 100 or method 200.

The computer subsystem 302, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 308 and electronic data storage unit 309 may be disposed in or otherwise part of the system 300 or another device. In an example, the processor 308 and electronic data storage unit 309 may be part of a standalone control unit or in a centralized quality control unit. Multiple processors 308 or electronic data storage units 309 may be used.

The processor 308 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 308 to implement various methods and functions may be stored in readable storage media, such as a memory in the electronic data storage unit 309 or other memory.

If the system 300 includes more than one computer subsystem 302, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 308 may be configured to perform a number of functions using the output of the system 300 or other output. For instance, the processor 308 may be configured to send the output to an electronic data storage unit 309 or another storage medium. The processor 308 may be further configured as described herein.

The processor 308 or computer subsystem 302 may be part of a defect review system, an inspection system, a metrology system, or some other type of system. Thus, the embodiments disclosed herein describe some configurations that can be tailored in a number of manners for systems having different capabilities that are more or less suitable for different applications.

The processor 308 may be configured according to any of the embodiments described herein. The processor 308 also may be configured to perform other functions or additional steps using the output of the system 300 or using images or data from other sources.

The processor 308 may be communicatively coupled to any of the various components or sub-systems of system 300 in any manner known in the art. Moreover, the processor 308 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 308 and other subsystems of the system 300 or systems external to system 300.

Various steps, functions, and/or operations of system 300 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 308 (or computer subsystem 302) or, alternatively, multiple processors 308 (or multiple computer subsystems 302). Moreover, different sub-systems of the system 300 may include one or more computing or logic systems. Therefore, the above description should not be interpreted as a limitation on the present disclosure but merely an illustration.

In an instance, the processor 308 is in communication with the electron beam system 300. The processor 308 is configured to generate an image of the workpiece 304 with a first astigmatism applied; apply an autofocus model to the image such that a Z focus offset is applied to the image; and determine a focus offset for the image. The processor 308 can be further configured to send instructions for a lens in the electron beam system 300 to adjust for the focus offset and to generate a second image of the workpiece 304 after the lens adjusts for the focus offset.

An additional embodiment relates to a non-transitory computer-readable medium storing program instructions executable on a controller for performing a computer-implemented autofocus method, as disclosed herein. In particular, as shown in FIG. 6, electronic data storage unit 309 or other storage medium may contain non-transitory computer-readable medium that includes program instructions executable on the processor 308. The computer-implemented method may include any step(s) of any method(s) described herein, including method 100 or method 200. The electronic data storage unit 309 can include the trained autofocus model.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An electron beam system comprising:
an electron beam source, wherein the electron beam source generates at least one electron beam;
a stage configured to hold a workpiece in a path of the electron beam;
at least one lens in the path of the electron beam that is configured to control astigmatism of the electron beam;
a detector configured to image the workpiece using the electron beam; and
a processor in electronic communication with the detector and the electron beam source, wherein the processor is configured to:
generate an image of the workpiece with a first astigmatism applied;
apply an autofocus model to the image, wherein the autofocus model is a deep learning neural network; and
determine a focus offset for the image using the autofocus model.

2. The electron beam system of claim 1, wherein an amount of the first astigmatism is a same as used during training of the autofocus model and a direction of the first astigmatism is a same as used during the training of the autofocus model.

3. The electron beam system of claim 1, wherein the processor includes at least one GPU.

4. The electron beam system of claim 1, wherein the autofocus model is trained using at least one model for a device on the workpiece.

5. The electron beam system of claim 1, wherein only one of the image with the first astigmatism is used to determine the focus offset.

6. The electron beam system of claim 1, wherein the electron beam source generates more than two electron beams.

7. The electron beam system of claim 1, wherein the processor is further configured to send instructions for the lens to adjust for the focus offset, and wherein the lens is an objective lens.

8. The electron beam system of claim 7, wherein the processor is further configured to send instructions to generate a second image of the workpiece after the lens adjusts for the focus offset.

9. A method comprising:
directing an electron beam at a workpiece on a stage, wherein the electron beam has a first astigmatism applied;
detecting the electron beam reflected off the workpiece using a detector;
generating, using a processor, an image of the workpiece with the first astigmatism applied;
applying, using the processor, an autofocus model to the image, wherein the autofocus model is a deep learning neural network; and
determining, using the processor, a focus offset for the image with the autofocus model.

10. The method of claim 9, further comprising training the autofocus model with at least one model for a device on the workpiece.

11. The method of claim 10, wherein an amount of the first astigmatism is a same as used during the training of the autofocus model and a direction of the first astigmatism is a same as used during the training of the autofocus model.

12. The method of claim 9, wherein only the image with the first astigmatism is used to determine the focus offset.

13. The method of claim 9, further comprising sending instructions, using the processor, to adjust for the focus offset in the electron beam.

14. The method of claim 13, further comprising generating a second image of the workpiece after the focus offset is adjusted.

15. The method of claim 9, wherein the directing includes more than two electron beams.

16. The method of claim 15, wherein the stage moves at a constant velocity during the directing.

17. The method of claim 15, wherein the stage moves prior to the generating.

18. A non-transitory computer-readable storage medium, comprising one or more programs for executing the following steps on one or more computing devices:
generating an image of a workpiece with a first astigmatism applied;
applying an autofocus model to the image, wherein the autofocus model is a deep learning neural network; and
determining a focus offset for the image using the autofocus model.

19. The non-transitory computer-readable storage medium of claim 18, wherein the steps include sending instructions to adjust for the focus offset.

20. The non-transitory computer-readable storage medium of claim 18, wherein an amount of the first astigmatism is a same as used during training of the autofocus model and a direction of the first astigmatism is a same as used during the training of the autofocus model.

* * * * *